(12) United States Patent
Yu et al.

(10) Patent No.: US 10,938,416 B2
(45) Date of Patent: Mar. 2, 2021

(54) MEMORY DEVICE INCLUDING PARITY ERROR DETECTION CIRCUIT

(71) Applicant: Samsung Electronics Co., Ltd., Suwon-si (KR)

(72) Inventors: Hye-Seung Yu, Goyang-si (KR); Sukyong Kang, Hwaseong-si (KR); Wonjoo Yun, Yongin-si (KR); Hyunui Lee, Osan-si (KR); Jae-Hun Jung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 126 days.

(21) Appl. No.: 16/262,127

(22) Filed: Jan. 30, 2019

(65) Prior Publication Data

US 2019/0165808 A1 May 30, 2019

Related U.S. Application Data

(62) Division of application No. 15/488,789, filed on Apr. 17, 2017, now Pat. No. 10,243,584.

(30) Foreign Application Priority Data

May 11, 2016 (KR) .................. 10-2016-0057765
Nov. 15, 2016 (KR) .................. 10-2016-0152185

(51) Int. Cl.
*H03M 13/00* (2006.01)
*H03M 13/09* (2006.01)
*G11C 29/52* (2006.01)
*G06F 11/10* (2006.01)

(52) U.S. Cl.
CPC ....... *H03M 13/098* (2013.01); *G06F 11/1048* (2013.01); *G06F 11/1068* (2013.01); *G11C 29/52* (2013.01); *H03M 13/611* (2013.01)

(58) Field of Classification Search
CPC ............... H03M 13/098; H03M 13/611; G06F 11/1048; G06F 11/1068; G11C 29/52
See application file for complete search history.

(56) References Cited

U.S. PATENT DOCUMENTS

| | | | |
|---|---|---|---|
| 5,781,564 A * | 7/1998 | Peterson | G06F 11/1008 714/747 |
| 6,189,127 B1 * | 2/2001 | Fang | G06F 11/221 370/216 |
| 6,598,197 B1 * | 7/2003 | Peterson | G11B 20/10009 714/758 |
| 6,862,248 B2 | 3/2005 | Shin | |
| 6,966,025 B2 * | 11/2005 | Urata | G11B 20/1803 714/800 |

(Continued)

FOREIGN PATENT DOCUMENTS

KR 10-2014-0126225 A 10/2014

*Primary Examiner* — Esaw T Abraham
(74) *Attorney, Agent, or Firm* — Harness, Dickey & Pierce, P.L.C.

(57) ABSTRACT

A memory device including a parity check circuit and a mask circuit may be provided. The parity check circuit may perform parity check on data sampled according to a data strobe signal, which does not include a post-amble. The mask circuit may generate a parity error signal based on results of the parity check, and output the parity error signal during a time period determined according to a burst length of the data.

6 Claims, 10 Drawing Sheets

(56) References Cited

U.S. PATENT DOCUMENTS

| | | |
|---|---|---|
| 7,158,433 B2 | 1/2007 | Riho et al. |
| 7,373,564 B2 | 5/2008 | Kikutake et al. |
| 7,506,226 B2 | 3/2009 | Gajapathy et al. |
| 7,532,537 B2 * | 5/2009 | Solomon ............... H05K 1/181 |
| | | 365/230.06 |
| 7,653,861 B2 | 1/2010 | Kanai et al. |
| 8,132,086 B2 | 3/2012 | Park et al. |
| 8,286,054 B2 | 10/2012 | Kawabata |
| 8,307,270 B2 | 11/2012 | Kim et al. |
| 8,533,578 B2 | 9/2013 | Ramaraju et al. |
| 8,687,440 B2 | 4/2014 | Iida |
| 8,806,316 B2 * | 8/2014 | Hwang ............... H03M 13/098 |
| | | 714/801 |
| 9,239,755 B2 * | 1/2016 | Jeon .................... G06F 11/1048 |
| 9,690,653 B2 | 6/2017 | Suzuki |
| 9,767,920 B2 | 9/2017 | Kim et al. |
| 9,953,702 B2 | 4/2018 | Son |
| 10,079,049 B2 * | 9/2018 | Shido .................... G11C 7/109 |
| 10,204,670 B2 * | 2/2019 | Kim .................... G11C 11/1673 |
| 10,381,102 B2 * | 8/2019 | Kajigaya ................. G06F 11/08 |
| 2008/0094918 A1 | 4/2008 | Fujizoe |
| 2011/0004814 A1 * | 1/2011 | Song .................... G11C 7/1078 |
| | | 714/799 |
| 2016/0118105 A1 | 4/2016 | Shido |
| 2017/0286218 A1 | 10/2017 | Kim |

* cited by examiner

MEMORY DEVICE INCLUDING PARITY ERROR DETECTION CIRCUIT

CROSS-REFERENCE TO RELATED APPLICATIONS

This U.S. non-provisional patent application is a divisional of U.S. application Ser. No. 15/488,789, filed on Apr. 17, 2017, now U.S. Pat. No. 10,243,584, which claims priority under 35 U.S.C. § 119 to Korean Patent Application Nos. 10-2016-0057765 filed May 11, 2016, and 10-2016-0152185 filed Nov. 15, 2016, in the Korean Intellectual Property Office, the entire contents of each of which are hereby incorporated by reference.

BACKGROUND

Example embodiments of the inventive concepts disclosed herein relate to semiconductor memory devices, and more particularly to memory devices including a parity error detection circuit.

Memory devices are being used as a voice and image data storage medium of information devices such as a computer, a cellular phone, a smartphone, a personal digital assistant (PDA), a digital camera, a camcorder, a voice recorder, an MP3 player, a handheld PC, a game console, a facsimile, a scanner, and a printer. Consumer's demands for memory devices are being diversified as memory devices are used as a storage medium in various devices.

Accordingly, technologies for high-capacity, high-speed, and/or low-power memory devices are being developed. As data processing of devices that support various functions increases, the capacity and speed of memory devices are increasing and accelerating. However, the probability that an error is generated upon receiving signals becomes higher as an operating speed of a memory device becomes higher. Thus, securing a stable operation of a memory device becomes a challenge.

To secure a stable operation of a high-speed memory device, the memory device may exchange data with a memory controller by using a parity scheme. For example, some memory devices use a parity error detection circuit to check whether data transmitted in the parity scheme are received without distortion.

SUMMARY

Some example embodiments of the inventive concepts provide memory devices including a parity error detection circuit, which performs parity check, in a memory system using a data strobe signal that does not have a post-amble.

According to an example embodiment, a memory device includes a parity check circuit and a mask unit. The parity check circuit performs parity check on data sampled according to a data strobe signal. The mask unit generates a parity error signal, which is output during a time period determined according to a burst length of the data, based on the parity check result. The data strobe signal does not include a post-amble.

According to an example embodiment, a memory device includes an aligner and a parity error detection circuit. The aligner samples data by a data strobe signal. The parity error detection circuit performs parity check on the data sampled by the aligner and generates a parity error signal that is output during a time period determined according to a burst length of the data and indicates whether a parity error is generated in the data. The data strobe signal does not include a post-amble.

According to an example embodiment, a memory device includes a parity check circuit configured to perform parity check on data sampled according to a data strobe signal, the data strobe signal not including a post-amble, and a mask circuit configured to generate a parity error signal based on results of the parity check, and output the parity error signal during a time period determined according to a burst length of the data.

According to an example embodiment, a memory device includes an aligner configured to sample data by a data strobe signal, the data strobe signal not including a post-amble, and a parity error detection circuit configured to perform parity check on the data sampled by the aligner to generate a parity error signal, and output the parity error signal during a time period determined according to a burst length of the data, the parity error signal indicating whether a parity error is generated in the data based on results of the parity check.

According to an example embodiment, a memory device includes a parity check circuit configured to perform a first parity check on data sampled according to a data strobe signal, the data strobe signal not including a post-amble, a mask signal generator configured to generate a mask signal, which is activated during a time period determined according to a burst length of the data, based on a write command, and an error signal generator configured to receive a parity signal from a host, perform a second parity check on results of the first parity check based on the parity signal, and generate the parity error signal based on the mask signal and results of the second parity check.

DETAILED DESCRIPTION

Below, some example embodiments of the inventive concepts may be described in detail and clearly to such an extent that an ordinary one in the art easily implements the inventive concepts.

Figure 1:
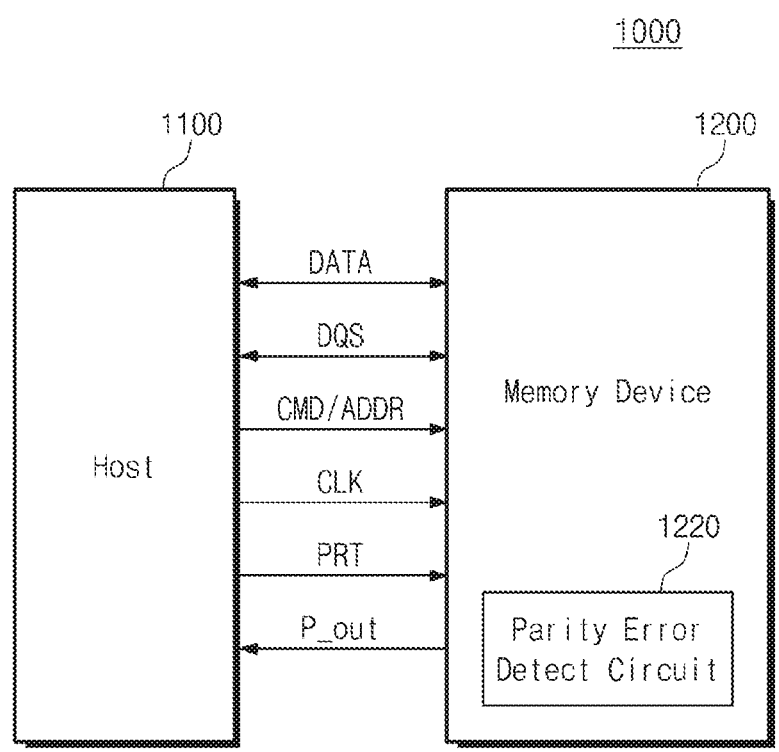
FIG. 1 is a block diagram illustrating a memory system, according to an example embodiment of the inventive concepts.

FIG. 1 is a block diagram illustrating a memory system, according to an example embodiment of the inventive concepts. Referring to FIG. 1, a memory system 1000 may include a host 1100 and a memory device 1200. For example, the memory system 1000 may be a single system that includes both the host 1100 and the memory device 1200. In some example embodiments, the host 1100 and the memory device 1200 of the memory system 1000 may be implemented with separate devices, respectively.

The host 1100 may be a processor circuit or system that includes a general-purpose processor or an application processor. In some example embodiments, the host 1100 may be a computing device including one or more processors. For example, the computing device may be a personal computer, a peripheral device, a digital camera, personal digital assistant (PDA), a portable media player (PMP), a smartphone, a tablet computer, or a wearable device.

The host 1100 may perform training on the memory device 1200 in a booting or specific situation. The host 1100 may improve reliability of data or signal exchange with the memory device 1200 by performing the training. For example, the host 1100 may write or read training data to or from the memory device 1200 in various conditions to determine optimum clock timing or an optimum reference level.

The memory device 1200 may store data provided from the host 1100 or data to be provided to the host 1100. The memory device 1200 may be implemented with any storage medium including a volatile memory or a nonvolatile memory. For example, in the case where the memory device 1200 includes a volatile memory, the volatile memory may include a DRAM, a static RAM (SRAM), a thyristor RAM (TRAM), a zero capacitor RAM (Z-RAM), a twin transistor RAM (TTRAM), or a magnetoresistive RAM (MRAM). The memory device 1200 may be a storage medium including a volatile memory. For example, the memory device 1200 may include an unbuffered dual in-line memory module (UDIMM), a registered DIMM (RDIMM), a load reduced DIMM (LRDIMM), Non Volatile DIMM (NVDIMM), a high bandwidth memory (HBM), etc.

For example, in the case where the memory device 1200 includes a nonvolatile memory, the nonvolatile memory may be an electrically erasable programmable read-only memory (EEPROM), a flash memory, an MRAM, a spin-transfer torque MRAM (STT-MRAM), a conductive bridging RAM (CBRAM), a ferroelectric RAM (FeRAM), a phase change RAM (PRAM), a resistive RAM (RRAM), a nanotube RRAM (RRAM), a polymer RAM (PoRAM), a nano-floating gate memory (NFGM), a holographic memory, a molecular electronic memory device, or an insulator resistance change memory. One or more bits may be stored in a unit cell of the nonvolatile memory. The above-described examples do not limit example embodiments.

Below, for ease of description, it is assumed that the memory device 1200 includes a single memory device. However, as described above, it may be easily understood that the example embodiments are applied to various storage devices.

The memory device 1200 may communicate with the host 1100. For example, the memory device 1200 may communicate with the host 1100 based on one or more of various wired communication protocols (e.g., a universal serial bus (USB), a small computer system interface (SCSI), Peripheral Component Interconnect Express (PCIe), a mobile PCIe (M-PCIe), advanced technology attachment (ATA), parallel ATA (PATA), serial ATA (SATA), serial attached SCSI (SAS), integrated drive electronics (IDE), Firewire, universal flash storage (UFS), or a transmission control protocol/Internet protocol (TCP/IP)), or various wireless communication protocols (e.g., long term evolution (LTE), Worldwide Interoperability for Microwave Access (WiMax), global system for mobile communication (GSM), code division multiple access (CDMA), high speed packet access (HSPA), Bluetooth, near field communication (NFC), Wi-Fi, or radio frequency identification (RFID)). The above-described examples do not limit example embodiments.

The memory device 1200 may perform a read or write operation on data DATA, which is synchronized with a data strobe signal DQS, in response to a command/address signal CMD/ADDR synchronized with a clock signal CLK from the host 1100. For example, the write operation and the read operation of the memory device 1200 may be as follows.

In the case of the read operation, the memory device 1200 is provided with an active command and a row address CMD/ADDR together with the clock signal CLK from the host 1100. After a first reference time, the memory device 1200 is provided with a column address from the host 1100. Then, the memory device 1200 provides requested data DATA to the host 1100 after a second reference time.

In the case of the write operation, first, the memory device 1200 is provided with the active command and the row address together with the clock signal CLK from the host 1100. After the reference time, the memory device 1200 is provided with a write command and a column address CMD/ADDR from the host 1100. Afterwards, the memory device 1200 is provided with data DATA to be written from the host 1100. The memory device 1200 writes the received data in a memory area that is defined by the column and row addresses.

According to an example embodiment of the inventive concepts, the memory device 1200 (or the host 1100) may be provided with the data DATA and the data strobe signal DQS from the host 1100 (or from the memory device 1200). The data strobe signal DQS may be a kind of clock signal. The data DATA that the memory device 1200 receives is synchronized with the data strobe signal DQS. When the memory device 1200 provides data DATA to the host 1100, the data strobe signal DQS is provided from the memory device 1200 to the host 1100. Also, when the host 1100 provides data DATA to the memory device 1200, the data strobe signal DQS is provided from the host 1100 to the memory device 1200.

The data strobe signal DQS may include a pre-amble and a post-amble. The preamble and the post amble are signals, which allow the memory device 1200 to synchronize, for example, an input buffer (not illustrated) and/or a clock buffer (not illustrated) thereof with the data strobe signal DQS before and after the memory device 1200 receives data from the host 1100, respectively. In the example embodiments disclosed herein, it is assumed that the data strobe signal DQS does not include the post-amble and includes only the pre-amble.

According to an example embodiment of the inventive concepts, the memory device 1200 may include a parity error detection circuit 1220. The parity error detection circuit 1220 may perform parity check on data to be written in the memory device 1200 through a write operation. Below, data to be written in the memory device 1200 through a write operation is referred to as "write data". The write data may be synchronized by the data strobe signal DQS provided from the host 1100 within the memory device 1200.

The parity error detection circuit 1220 may be provided with a parity signal PRT from the host 1100, and may perform additional parity check on the write data using the parity signal PRT. The additional parity check performed on the write data using the parity signal PRT will be described with reference to FIG. 9. The parity error detection circuit 1220 may provide the host 1100 with a parity output P_out as the parity check result.

The parity error detection circuit 1220 may perform the parity check on data that is aligned based on the data strobe signal DQS and output the parity output signal P_out as the parity check result. In the case where the data strobe signal DQS includes the post-amble, because the parity error detection circuit 1220 operates in synchronization with the data strobe signal DQS, the parity output signal P_out that includes a result of the parity check on the last bit of the write data may be reset by the post-amble of the data strobe signal DQS.

However, as described above, according to an example embodiment of the inventive concepts, the data strobe signal DQS may not include the post-amble. Thus, the parity output signal P_out that includes the parity check result on the last bit of the write data may not be reset by the data strobe signal DQS. Accordingly, the parity output signal P_out that includes the parity check result on the last bit of the write data may be maintained, without being reset by the data strobe signal DQS. If the parity output signal P_out is not reset at an edge of the data strobe signal DQS, the memory device 1200 fails to comply with a communication protocol of the memory system 1000 that is defined by a standard specification of the Joint Electron Device Engineering Council (JEDEC).

According to an example embodiment of the inventive concepts, the parity error detection circuit 1220 may adjust a time period, in which the parity output signal P_out is output according to the burst length BL, based on the data strobe signal DQS including no post-amble. Here, the burst length BL means the number of serial data that are continuously exchanged between the memory device 1200 and the host 1100.

The parity error detection circuit 1220 that adjusts a time period, in which the parity output signal P_out is output, based on the burst length BL, and a configuration of the memory device 1200 including the parity error detection circuit 1220 are described above. Through the above-described configuration, even though the memory device 1200 is provided with the post-amble-free data strobe signal DQS, the memory device 1200 may output the parity output signal P_out during a time period that is determined according to the burst length BL. Accordingly, the memory device 1200 can comply with a communication protocol of the memory system 1000 that is defined by the JEDEC standard specification.

Figure 2:
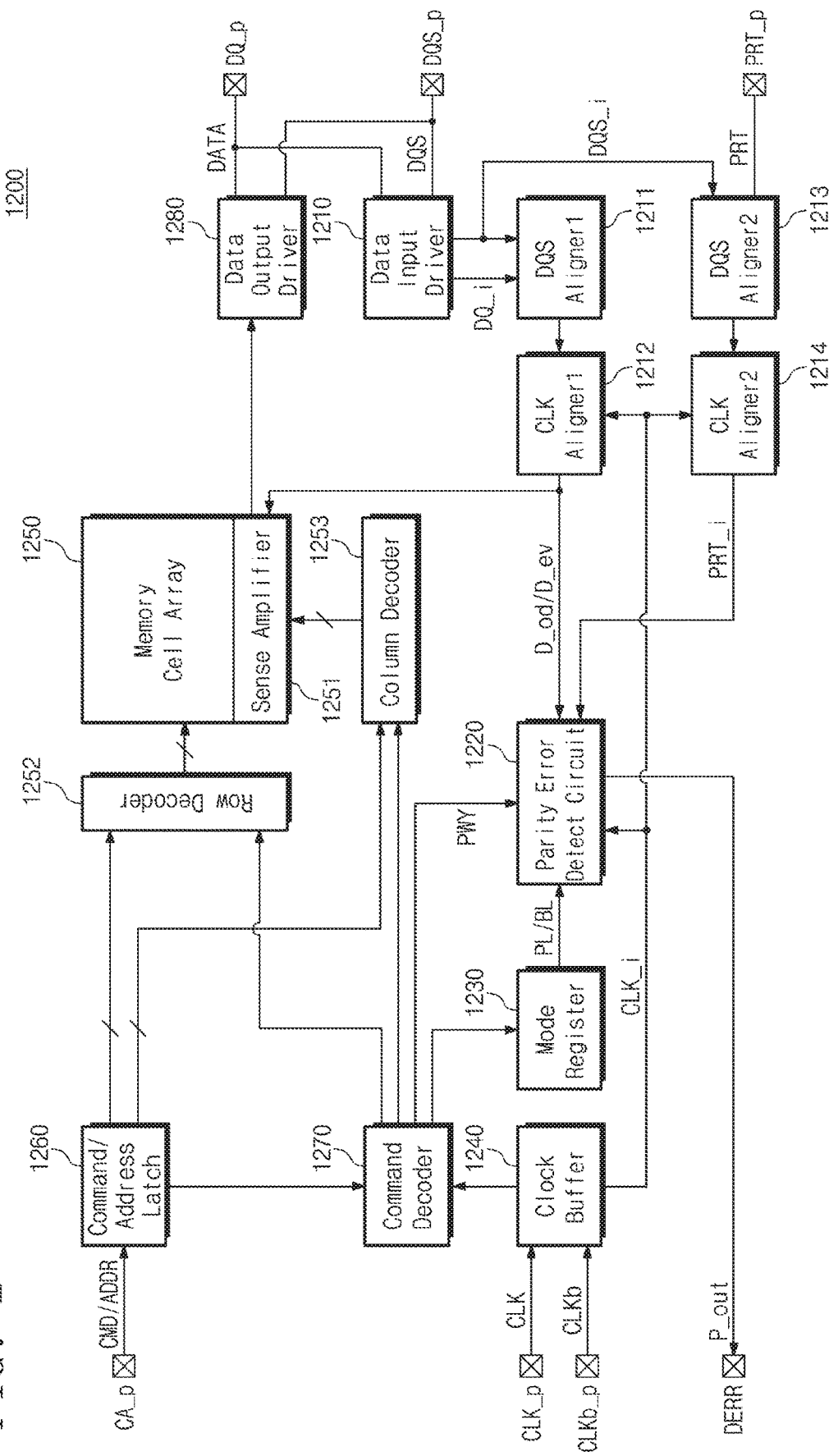
FIG. 2 is a block diagram illustrating the memory device illustrated in FIG. 1.

FIG. 2 is a block diagram illustrating the memory device 1200 illustrated in FIG. 1. FIG. 2 will be described with reference to FIG. 1. Referring to FIG. 2, the memory device 1200 may include a data input driver 1210, first and second DQS aligners 1211 and 1213, first and second clock aligners 1212 and 1214, the parity error detection circuit 1220, a mode register 1230, a clock buffer 1240, a memory cell array 1250, a command/address latch 1260, a command decoder 1270, and a data output driver 1280.

When the memory device 1200 performs a write command, the data input driver 1210 receives the write data DATA and the data strobe signal DQS from the host 1100 through a DQ pad DQ_p and a DQS pad DQS_p, respectively. As described above, the data strobe signal DQS may not include the post-amble. The data input driver 1210 may output the received write data and the received data strobe signal DQS as internal data DQ_i and an internal DQS signal DQS_i, respectively.

The first DQS aligner 1211 may align the internal data DQ_i with the internal DQS signal DQS_i. For example, the first DQS aligner 1211 may sample the internal data DQ_i at rising and falling edges of the internal DQS signal DQS_i, respectively, and output the internal data DQ_i to be classified into odd data and even data that are aligned with the internal DQS signal DQS_i. The odd data means odd-numbered data of the internal data DQ_i, and the even data means even-numbered data of the internal data DQ_i.

The first clock aligner 1212 may sample and align the odd data and the even data of the internal data DQ_i by the internal clock signal CLK_i. The first clock aligner 1212 may output the data aligned by the internal clock signal CLK_i as odd alignment data D_od and even alignment data D_ev. The odd alignment data D_od and the even alignment data D_ev may be provided to each of the parity error detection circuit 1220 and a sense amplifier 1251.

The second DQS aligner 1213 may sample and align the parity signal PRT, which is provided from the host 1100 through a parity pad PRT_p, by the internal DQS signal DQS_i. Although not illustrated in FIG. 2, the memory device 1200 may further include an input driver for receiving the parity signal PRT. The second clock aligner 1214 may sample and align the parity signal PRT, which is sampled by the internal DQS signal DQS_i, by the internal clock signal CLK_i. The second clock aligner 1214 may output the parity signal PRT, which is aligned by the internal clock signal CLK_i, as an internal parity signal PRT_i.

The parity error detection circuit 1220 may perform the parity check on the odd alignment data D_od and the even alignment data D_ev by using the internal clock signal CLK_i. The parity error detection circuit 1220 may be provided with the internal parity signal PRT_i and perform the additional parity check on data by using the internal parity signal PRT_i.

Further, the parity error detection circuit 1220 may be provided with a decoded pulse write command PWY from the command decoder 1270 and a parity latency PL and a burst length BL from the mode register 1230. The parity error detection circuit 1220 may generate a mask signal (not illustrated) for adjusting a time period, in which the parity output signal P_out is output, based on the decoded pulse write command PWY and the burst length BL of data. That is, the time period in which the parity output signal P_out is output may be adjusted by the mask signal. The parity error detection circuit 1220 may adjust an output time point of the parity output signal P_out based on the parity latency PL. The parity output signal P_out may be provided to the host 1100 through a parity output pad DERR.

The mode register 1230 may store information provided from the command decoder 1270. For example, the mode register 1230 may store the parity latency PL and the burst length BL that are provided from the command decoder 1270. Further, the mode register 1230 may provide the parity latency PL and the burst length BL to the parity error detection circuit 1220.

The clock buffer 1240 may be provided with a clock signal CLK and a clock bar signal CLKb from the host 1100 through a clock pad CLK__p and a clock bar pad CLK_p. For example, the clock buffer 1240 may be implemented with a differential input buffer. The clock buffer 1240 may generate the internal clock signal CLK_i based on the clock signal CLK and the clock bar signal CLKb. The internal clock signal CLK_i may be provided to the parity error detection circuit 1220, the first and second clock aligners 1212 and 1214, and the command decoder 1270.

Data stored in the memory cell array 1250 may be provided to the data output driver 1280 through the sense amplifier 1251. In some example embodiments, the odd alignment data D_od and the even alignment data D_ev may be stored in the memory cell array 1250 by the sense amplifier 1251. Addresses of memory cells, in which data provided from the host 1100 are to be stored, may be provided to the memory cell array 1250 through command/address latch 1260, the row decoder 1252, and the column decoder 1253.

The command/address latch 1260 receives a command signal CMD and an address signal ADDR from the host 1100 through a command/address pad CA_p. The command/address latch 1260 may provide the received command CMD to the command decoder 1270. Also, the command/address latch 1260 may provide the received address to the row decoder 1252 and the column decoder 1253. The command decoder 1270 may be provided with various commands through the command/address latch 1260. The command decoder 1270 may provide a decoded command to elements such as the parity error detection circuit 1220, the mode register 1230, the row decoder 1252, and the column decoder 1253.

The data output driver 1280 may output data stored in the memory cell array 1250 to the host 1100 through the DQ pad DQ_p. To this end, row decoder 1252 and the column decoder 1253 may provide addresses of memory cells, in which data to be output are stored, to memory cell array 1250. Further, when the data output driver 1280 outputs data to the host 1100, the data output driver 1280 may provide the data strobe signal DQS to the host 1100 through the DQS pad DQS_p.

Figure 3:
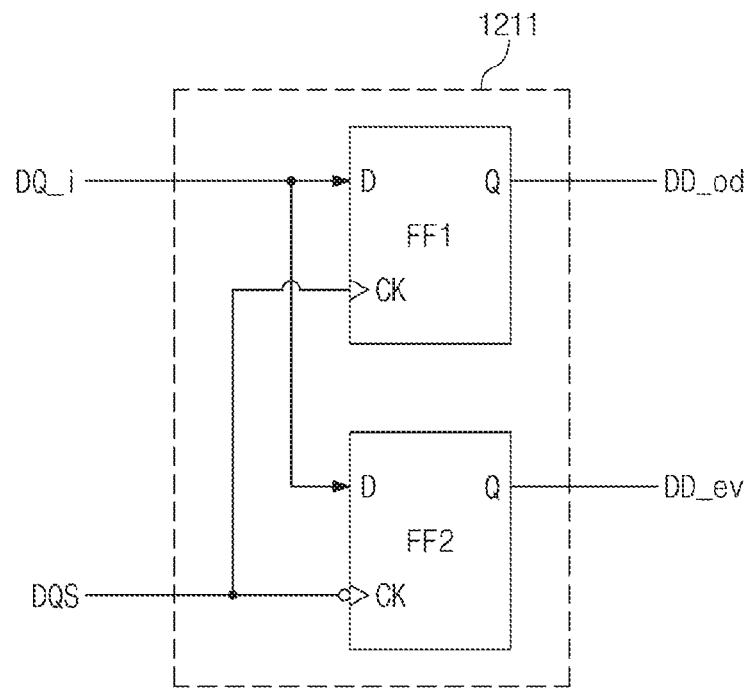
FIG. 3 is a block diagram illustrating the first DQS aligner illustrated in FIG. 2.

FIG. 3 is a block diagram illustrating the first DQS aligner 1211 illustrated in FIG. 2. FIG. 3 will be described with reference to FIG. 2. Referring to FIG. 3, the first DQS aligner 1211 may include first and second flip-flops FF1 and FF2.

The first flip-flop FF1 may be provided with the internal data DQ_i as a data input D and the data strobe signal DQS_i as a clock input CK. The first flip-flop FF1 may sample the internal data DQ_i by a rising edge of the data strobe signal DQS_i. Odd-numbered data of the internal data DQ_i may be sampled by the rising edge of the data strobe signal DQS_i, and the first flip-flop FF1 may output the sampled data as odd data DD_od.

The second flip-flop FF2 may be provided with the internal data DQ_i as a data input D and a bar signal of the data strobe signal DQS_i as a clock input CK. The second flip-flop FF2 may sample the internal data DQ_i by a falling edge of the data strobe signal DQS_i. Even-numbered data of the internal data DQ_i may be sampled by the falling edge of the data strobe signal DQS_i, and the second flip-flop FF2 may output the sampled data as even data DD_ev.

Accordingly, the first flip-flop FF1 and the second flip-flop FF2 may sample and align the internal data DQ_i by the rising edge and the falling edge of the data strobe signal DQS_i, respectively. The first flip-flop FF1 and the second flip-flop FF2 may output the odd data DD_od and the even data DD_ev, respectively, based on the sampled data.

The second DQS aligner 1213 illustrated in FIG. 2 may include the same configuration as the first DQS aligner 1211. The second DQS aligner 1213 may be provided with the parity signal PRT from the host 1100 through the parity pad PRT_p and may sample the parity signal PRT by the rising edge and the falling edge of the data strobe signal DQS_i. The second DQS aligner 1213 may output as an odd parity signal (not illustrated) and an even parity signal (not illustrated), respectively, based on the sampled parity signal PRT.

Figure 4:
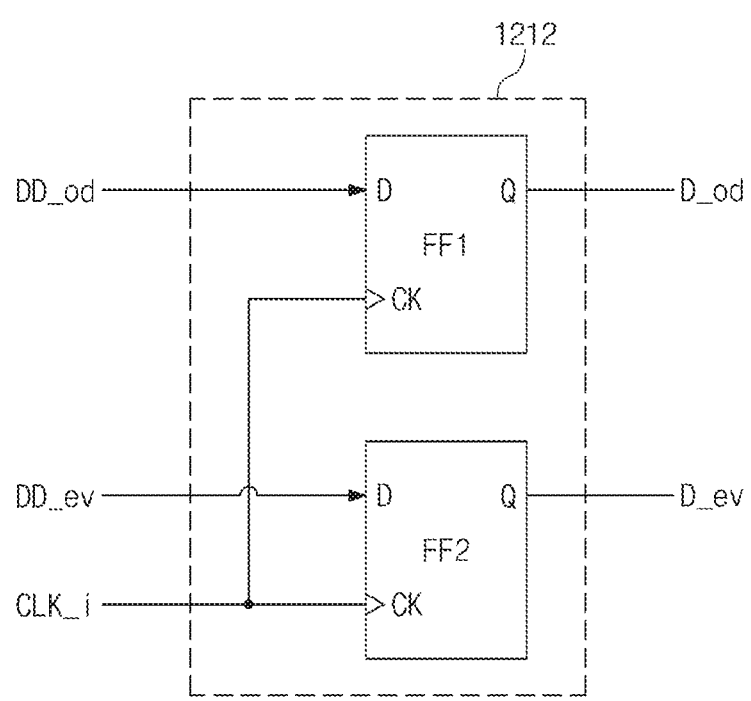
FIG. 4 is a block diagram illustrating the first clock aligner illustrated in FIG. 2.

FIG. 4 is a block diagram illustrating the first clock aligner illustrated in FIG. 2. FIG. 4 will be described with reference to FIG. 2. Referring to FIG. 4, the first clock aligner 1212 may include first and second flip-flops FF1 and FF2.

The first flip-flop FF1 may be provided with the odd data DD_od as a data input D and the internal clock signal CLK_i as a clock input CK. The first flip-flop FF1 may sample the odd data DD_od by a rising edge of the internal clock signal CLK_i. The first flip-flop FF1 may output the sampled data as the odd alignment data D_od.

The second flip-flop FF2 may be provided with the even data DD_ev as a data input D and the internal clock signal CLK_i as a clock input CK. The second flip-flop FF2 may sample the even data DD_ev by the rising edge of the internal clock signal CLK_i. The second flip-flop FF2 may output the sampled data as the even alignment data D_ev.

Accordingly, the first flip-flop FF1 and the second flip-flop FF2 may sample and align the odd data DD_od and the even data DD_ev, respectively, by the rising edge of the internal clock signal CLK_i, and output the sampled data as the odd alignment data D_od and the even alignment data D_ev, respectively.

The second clock aligner 1214 illustrated in FIG. 2 may include the same configuration as the first clock aligner 1212. The second clock aligner 1214 may be provided with an odd parity signal (not illustrated) and an even parity signal (not illustrated) from the second DQS aligner 1213 and may sample the odd parity signal and the even parity signal by the rising edge of the internal clock signal CLK_i. The second DQS aligner 1213 may output the sampled signal as an odd alignment parity signal (not illustrated) and an even alignment parity signal (not illustrated).

Figure 5:
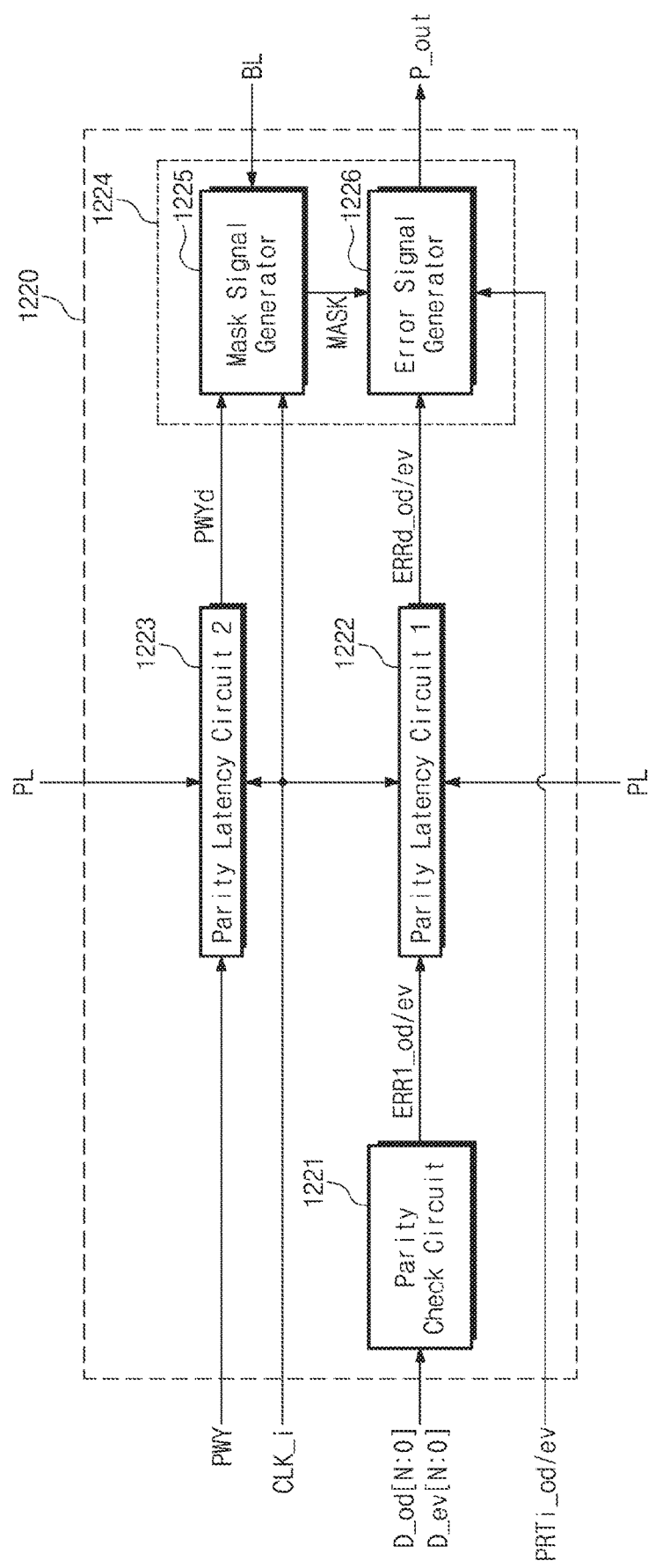
FIG. 5 is a block diagram illustrating the parity error detection circuit illustrated in FIG. 2.

FIG. 5 is a block diagram illustrating the parity error detection circuit illustrated in FIG. 2. The block diagram of FIG. 5 will be described with reference to FIGS. 1 and 2. Referring to FIG. 5, the parity error detection circuit 1220 may include a parity check circuit 1221, first and second parity latency circuits 1222 and 1223, and a mask circuit 1224.

The parity check circuit 1221 may be provided with odd alignment data D_od[N:0] and even alignment data D_ev[N:0] from the first clock aligner 1212. Here, the number "N" of bits may depend on a width of a data bus of the memory device 1200. For example, in the case where the memory device 1200 includes a data bus that is connected with "M" DQ pads DQ_p, the number "N" of bits may be "M".

Below, it is assumed that the number "N" of bits is "3". Accordingly, the memory device 1200 includes first to fourth DQ pads DQ_p[3:0]. Odd alignment data D_od[0] and even alignment data D_ev[0] are data that are generated by aligning data provided through the first DQ pad DQ_p[0] by the internal DQS signal DQS_i and the internal clock signal CLK_i. As in the above description, odd alignment data D_od[3:1] and even alignment data D_ev[3:1] are data that are generated by aligning data provided through the fourth to second DQ pad DQ_p[3:1] by the internal DQS signal D_i and the internal clock signal CLK_i, respectively.

The parity check circuit 1221 may perform parity check on the provided data. The parity check circuit 1221 may output the parity check result as a first odd error signal ERR1_od and a first even error signal ERR1_ev, respectively. A configuration of the first parity check circuit 1221 will be described with reference to FIG. 6.

The first parity latency circuit 1222 may be provided with the internal clock signal CLK_i from the clock buffer 1240. The first parity latency circuit 1222 may delay each of the first odd error signal ERR1_od and the first even error signal ERR1_ev by a multiple of a period of the internal clock signal CLK_i based on the parity latency PL. The first parity latency circuit 1222 may output the delayed signals as a delayed odd error signal ERRd_od and a delayed even error signal ERRd_ev.

The second parity latency circuit 1223 may be provided with the internal clock signal CLK_i from the clock buffer 1240. Further, the second parity latency circuit 1223 may be provided with a decoded pulse write command PWY from the command decoder 1270. The second parity latency circuit 1223 may delay the decoded pulse write command PWY by a multiple of a period of the internal clock signal CLK_i based on the parity latency PL. The second parity latency circuit 1223 may output the delayed command as a delayed decoded pulse write command PWYd. A configuration of the second parity latency circuit 1223 will be described with reference to FIG. 7.

The mask circuit 1224 may be provided with the delayed odd error signal ERRd_od, the delayed even error signal ERRd_ev, the delayed decoded pulse write command PWYd, the internal clock signal CLK_i, and the burst length BL. The mask circuit 1224 may generate the parity output signal P_out indicating whether a parity error is generated in data, based on the provided signals. The mask circuit 1224 may output the parity output signal P_out during a time period that is determined according to the burst length BL.

The mask circuit 1224 may include a mask signal generator 1225 and an error signal generator 1226. The mask signal generator 1225 may be provided with the delayed decoded pulse write command PWYd and the burst length BL. The mask signal generator 1225 may generate a mask signal MASK by adjusting a pulse of the delayed decoded pulse write command PWYd based on the burst length BL. A configuration of the mask signal generator 1225 will be described with reference to FIG. 8.

The error signal generator 1226 may be provided with the delayed odd error signal ERRd_odd, the delayed even error signal ERRd_ev, and the mask signal MASK. The error signal generator 1226 may be further provided with the internal parity signal PRT_i. The internal parity signal PRT_i may include the odd parity signal PRTi_odd and the even parity signal PRTi_ev. The error signal generator 1226 may determine whether a parity error of write data is a parity error of odd data of the write data or a parity error of even data of the write data, based on the odd parity signal PRTi_odd and the even parity signal PRTi_ev.

The error signal generator 1226 may perform the parity check on the write data based on the delayed odd error signal ERRd_odd, the delayed even error signal ERRd_ev, and the internal parity signal PRT_i. The error signal generator 1226 may output the parity check result as the parity output signal P_out during activation of the mask signal MASK. A configuration of the error signal generator 1226 will be described with reference to FIG. 9.

Figure 6:
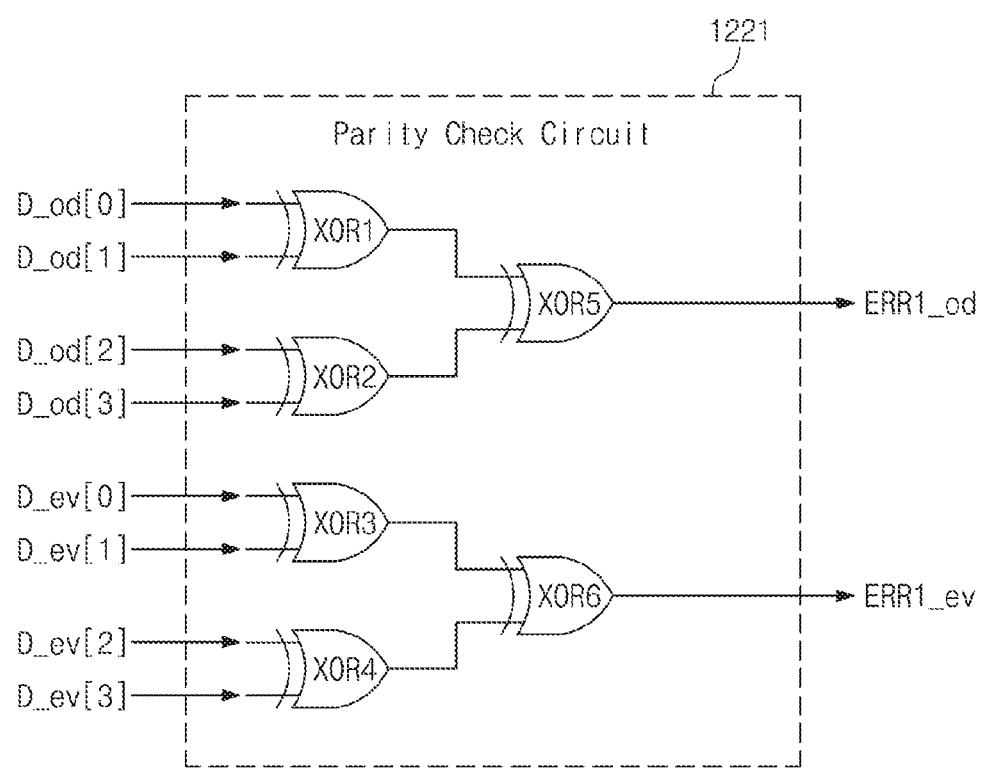
FIG. 6 is a circuit diagram illustrating the parity check circuit illustrated in FIG. 5.

FIG. 6 is a circuit diagram illustrating the parity check circuit illustrated in FIG. 5. The circuit diagram of FIG. 6 will be described with reference to FIGS. 1 and 5. Referring to FIG. 6, the parity check circuit 1221 may include first to sixth exclusive OR logics XOR1 to XOR6.

As described above, the parity check circuit 1221 may check parities of the odd alignment data D_od[3:0] and the even alignment data D_ev[3:0]. For example, the memory device 1200 may be provided with data from the host 1100 in an even parity scheme. In this case, the odd alignment data D_od[3:0] may be provided from the host 1100 such that bits at the same location (hereinafter referred to as a "bit string") have even number of logic "1"s. Further, the even alignment data D_ev[3:0] may be provided from the host 1100 such that a bit string includes even number of logic "1"s.

For example, in the case where data are provided from the host 1100 in the even parity scheme, "1011" may be provided as the even alignment data D_ev[0], "1001" may be provided as the even alignment data D_ev[1], "1100" may be provided as the even alignment data D_ev[2], and "1111" may be provided as the even alignment data D_ev[3]. In this case, data of the first bit string of the even alignment data D_ev[3:0] are "1111." Because the number of logic "1"s is even, the parity error is not generated. Further, data of the second bit string of the even alignment data D_ev[3:0] and data of the third bit string of the even alignment data D_ev[3:0] are "0011" and "1001," respectively. Because the number of logic "1"s included in data of each of the second and third bit string is even, the parity error is not generated. Data of the fourth bit string of the even alignment data D_ev[3:0] is "1101." Because the number of logic "1"s included in data of the fourth bit string is odd, the parity error is generated.

The above-described example describes the case where the memory device 1200 is provided with data from the host 1100 in the even parity scheme. In some example embodiments, the memory device 1200 may be provided with data from the host 1100 in an odd parity scheme. In this case, each of the odd alignment data D_od[3:0] and the even alignment data D_ev[3:0] may be provided from the host 1100 such that a bit string of the same location includes an odd number of logic "1"s. Below, it is assumed that the memory system 1000 of FIG. 1 exchanges data in the even parity scheme.

The first, second, and fifth exclusive OR logics XOR1, XOR2, and XOR5 may check a parity of the odd alignment data D_od[3:0]. The parity check result may be output as the first odd error signal ERR1_od. The third, fourth, and sixth exclusive OR logics XOR3, XOR4, and XOR6 may check a parity of the even alignment data D_ev[3:0]. The parity check result may be output as the first even error signal ERR1_ev.

For example, when a parity error is generated in the odd alignment data D_od[3:0], the first odd error signal ERR1_od having logic "1" may be output. When a parity error is generated in the even alignment data D_ev[3:0], the first even error signal ERR1_ev having logic "1" may be output.

In contrast, in the memory system 1000 that uses the odd parity scheme, when a parity error is generated in the odd alignment data D_od[3:0] or the even alignment data D_ev[3:0], the first odd error signal ERR1_od or the first even error signal ERR1_ev may have a value (for example, logic "0") that is opposite to a value in the case where the memory system 1000 uses the even parity scheme.

Figure 7:
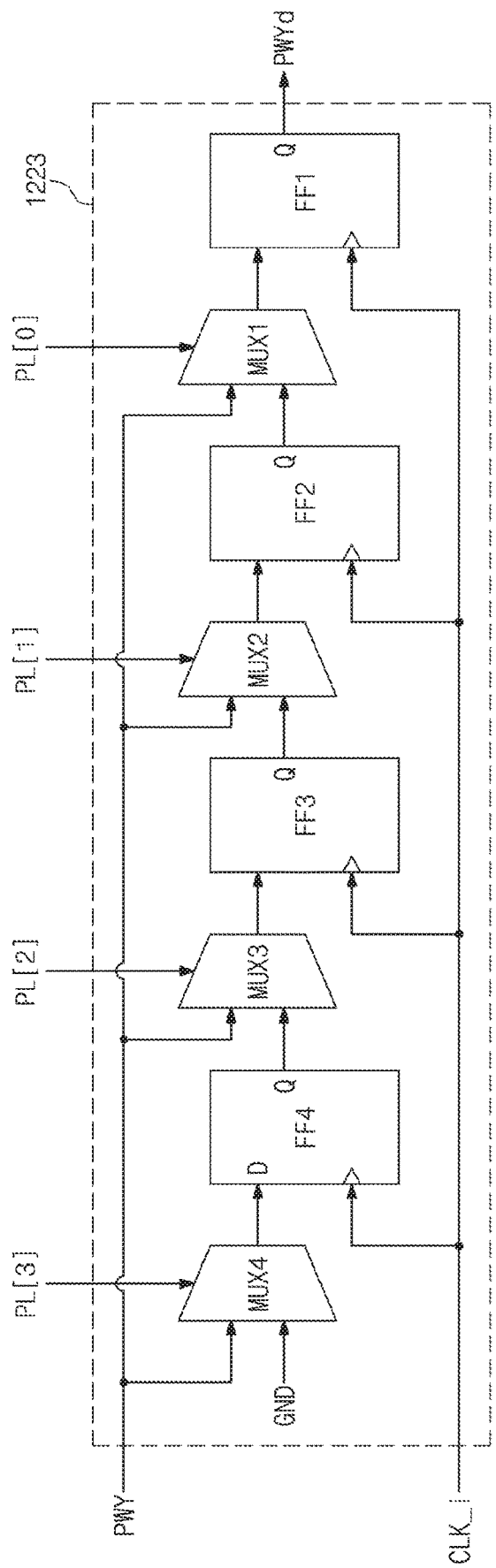
FIG. 7 is a block diagram illustrating the second parity latency unit illustrated in FIG. 5.

FIG. 7 is a block diagram illustrating the second parity latency circuit illustrated in FIG. 5. FIG. 7 will be described with reference to FIG. 5. Referring to FIG. 7, the second parity latency circulate 1223 may include first to fourth multiplexers MUX1 to MUX4 and first to fourth flip-flops FF1 to FF4.

The first multiplexer MUX1 may select and output one of the decoded pulse write command PWY or an output signal of the second flip-flop FF2 based on a parity latency PL[0]. An output signal of the first multiplexer MUX1 may be provided to the first flip-flop FF1. The first flip-flop FF1 may sample the output signal of the first multiplexer MUX1 by the internal clock signal CLK_i and output the sampled signal as a signal having a length of one period of the internal clock signal CLK_i. The output signal may be provided to the mask signal generator 1225 as the delayed decoded pulse write command PWYd.

As in the first multiplexer MUX1, the second multiplexer MUX2 may select and output one of the decoded pulse write command PWY or an output signal of the third flip-flop FF3 based on a parity latency PL[1], and the third multiplexer MUX3 may select and output one of the decoded pulse write command PWY or an output signal of the fourth flip-flop FF4 based on a parity latency PL[2]. An output signal of the second multiplexer MUX2 may be provided to the second flip-flop FF2. An output signal of the third multiplexer MUX3 may be provided to the third flip-flop FF3. The second and third flip-flops FF2 and FF3 may sample the output signals of the second and third multiplexers MUX2 and MUX3 by the internal clock signal CLK_i, respectively, and output the sampled signals as a signal having a length of one period of the internal clock signal CLK_i.

The fourth multiplexer MUX4 may provide the fourth flip-flop FF4 with one of the decoded pulse write command PWY or a ground voltage GND based on a parity latency PL[3]. The fourth flip-flop FF4 may sample the output signal of the fourth multiplexer MUX4 by the internal clock signal CLK_i and output the sampled signal as a signal having a length of one period of the internal clock signal CLK_i.

In the case where the parity latency PL[0] is activated, the decoded pulse write command PWY may be provided to the first flip-flop FF1 through the first multiplexer MUX1 without passing through the second to fourth flip-flops FF2 to FF4. Accordingly, the decoded pulse write command PWY may be sampled by a first rising edge of the internal clock signal CLK_i without delay. The sampled decoded pulse write command PWY may be converted into a pulse signal having a length of one period of the internal clock signal CLK_i without delay, and the converted signal may be output as the delayed decoded pulse write command PWYd.

In the case where the parity latency PL[1] is activated, the decoded pulse write command PWY may be provided to the second flip-flop FF2 through the second multiplexer MUX2. The decoded pulse write command PWY may be converted and output into a pulse signal having a length of one period of the internal clock signal CLK_i by the second flip-flop FF2. The output signal may be output as the delayed decoded pulse write command PWYd through the first multiplexer MUX1 and the first flip-flop FF1. That is, the decoded pulse write command PWY may be output as the delayed decoded pulse write command PWY after delayed through the first and second flip-flops FF1 and FF2 by one period of the internal clock signal CLK_i.

As in the above description, in the case where the parity latency PL[2] is activated, the decoded pulse write command PWY may be provided to the third flip-flop FF3 through the third multiplexer MUX3. A pulse signal sampled by the third flip-flop FF3 may be output as the delayed decoded pulse write command PWYd through the second multiplexer MUX2, the second flip-flop FF2, the first multiplexer MUX1, and the first flip-flop FF1. Accordingly, the decoded pulse write command PWY may be output as the delayed decoded pulse write command PWYd after delayed through the first to third flip-flops FF1 to FF3 by two periods of the internal clock signal CLK_i.

In the case where the parity latency PL[3] is activated, the decoded pulse write command PWY may be provided to the fourth flip-flop FF4 through the fourth multiplexer MUX4. A pulse signal sampled by the third flip-flop FF4 may be output as the delayed decoded pulse write command PWYd through the third multiplexer MUX3, the third flip-flop FF3, the second multiplexer MUX2, the second flip-flop FF2, the first multiplexer MUX1, and the first flip-flop FF1. Accordingly, the decoded pulse write command PWY may be output as the delayed decoded pulse write command PWYd after delayed through the first to fourth flip-flops FF1 to FF4 by three periods of the internal clock signal CLK_i.

A configuration of the first parity latency circuit 1222 may be the same as or substantially similar to a configuration of the second parity latency circuit 1223. The first parity latency circuit 1222 may be provided with each of the first odd error signal ERR1_od and the first even error signal ERR1_ev and delay the first odd error signal ERR1_od and the first even error signal ERR1_ev by a multiple of a period of the internal clock signal CLK_i based on the parity latency PL. The first parity latency circuit 1222 may output the delayed signals as the delayed odd error signal ERRd_od and the delayed even error signal ERRd_ev. It may be understood to one skilled in the art that the first parity latency circuit 1222 is configured with reference to the configuration of the second parity latency circuit 1223 illustrated in FIG. 7.

Figure 8:
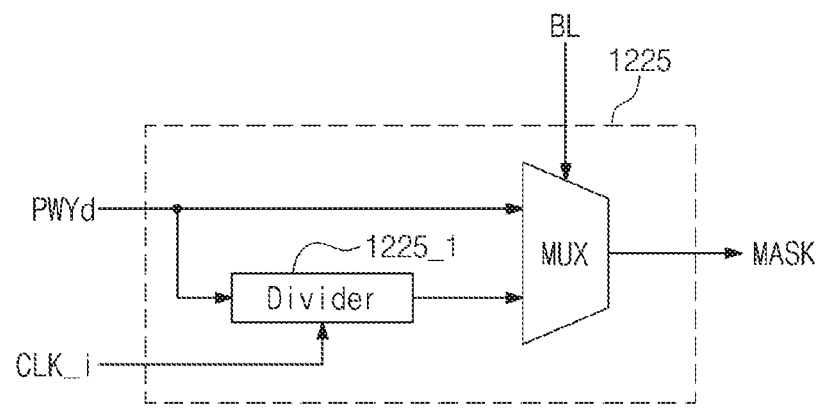
FIG. 8 is a block diagram illustrating the mask signal generator illustrated in FIG. 5.

FIG. 8 is a block diagram illustrating the mask signal generator illustrated in FIG. 5. The block diagram of FIG. 8 will be described with reference to FIGS. 2 and 5. Referring to FIG. 8, the mask signal generator 1225 may include a divider 1225_1 and a multiplexer MUX.

The divider 1225_1 may be provided with the delayed decoded pulse write command PWYd and the internal clock signal CLK_i. The divider 1225_1 may convert the delayed decoded pulse write command PWYd into a pulse signal having a length of twice a period of the internal clock signal CLK_i based on the internal clock signal CLK_i and the delayed decoded pulse write command PWYd.

On the basis of the burst length BL, the multiplexer MUX may output one of the delayed decoded pulse write command PWYd, which has a pulse of a period of the internal clock signal CLK_i, and a signal, which is converted by the divider 1225_1 and has a pulse of two periods of the internal clock signal CLK_i, as the mask signal MASK. For example, in the case where the burst length BL is "2", the multiplexer MUX may output the delayed decoded pulse write commands PWYd, which has a pulse of a period of the internal clock signal CLK_i, as the mask signal MASK. As another example, in the case where the burst length BL is "4", the multiplexer MUX may output the signal, which is converted by the divider 1225_1 and has a pulse of two periods of the internal clock signal CLK_i, as the mask signal MASK.

Figure 9:
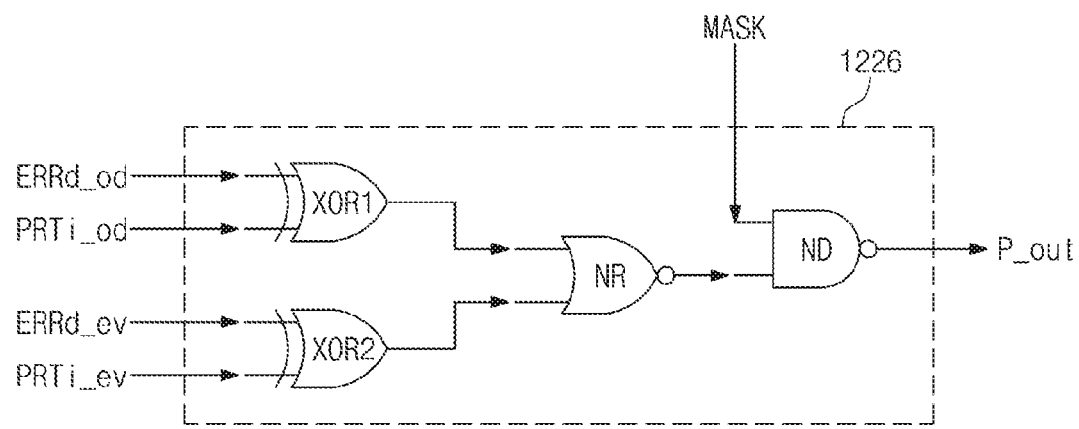
FIG. 9 is a block diagram illustrating the error signal generator illustrated in FIG. 5.

FIG. 9 is a block diagram illustrating the error signal generator illustrated in FIG. 5. The block diagram of FIG. 9 will be described with reference to FIGS. 2 and 5. Referring to FIG. 9, the error signal generator 1226 may include first and second exclusive OR logics XOR1 and XOR2, a NOR logic NR, and a NAND logic ND.

The first exclusive OR logic XOR1 may perform an exclusive OR operation on the delayed odd error signal ERRd_od and the odd parity signal PRTi_od. The second exclusive OR logic XOR2 may perform an exclusive OR operation on the delayed even error signal ERRd_ev and the even parity signal PRTi_ev. As described above, the error signal generator 1226 may determine whether a parity error of write data is a parity error of odd data of the write data or a parity error of even data thereof, based on the odd parity signal PRTi_odd and the even parity signal PRTi_ev.

For example, when a parity error of odd data of the write data is generated, the delayed odd error signal ERRd_od having logic "1" may be output, and thus, the parity output signal P_out having logic "1" is output. The host 1100 may not be able to identify which one of the odd parity signal PRTi_odd and the even parity signal PRTi_ev caused to output logic "1." In some example embodiments, the host 1100 may be configured to sequentially provide the odd parity signal PRTi_odd of logic "1" and the even parity signal PRTi_ev of logic "1" to the error signal generator 1226. If the odd parity signal PRTi_od has logic "1," then the parity output signal P_out may have logic "0." Thus, the host 1100 may determine that a parity error has occurred in the odd data of the write data.

The NOR logic NR may perform a NOR operation on output signals of the first and second exclusive OR logics XOR1 and XOR2. That is, the NOR logic NR may output a result of performing an OR operation on the delayed odd error signal ERRd_od, the odd parity signal PRTi_od, the delayed even error signal ERRd_ev, and the even parity signal PRTi_ev. Accordingly, the NOR logic NR may output a parity check result that is obtained by performing additional parity check on the parity check result of the write data by using the parity signal PRT.

The NAND logic ND may perform a NAND operation on the mask signal MASK and an output signal of the NOR logic NR. With the above description, the NAND logic ND may output an inverted signal of the output signal of the NOR logic NR by a pulse width of the mask signal MASK. As described above, a pulse width of the mask signal MASK may be adjusted according to the burst length BL. This means that the NAND logic ND may output the inverted signal of the output signal of the NOR logic NR during a time period that is determined according to the burst length BL.

Figure 10:
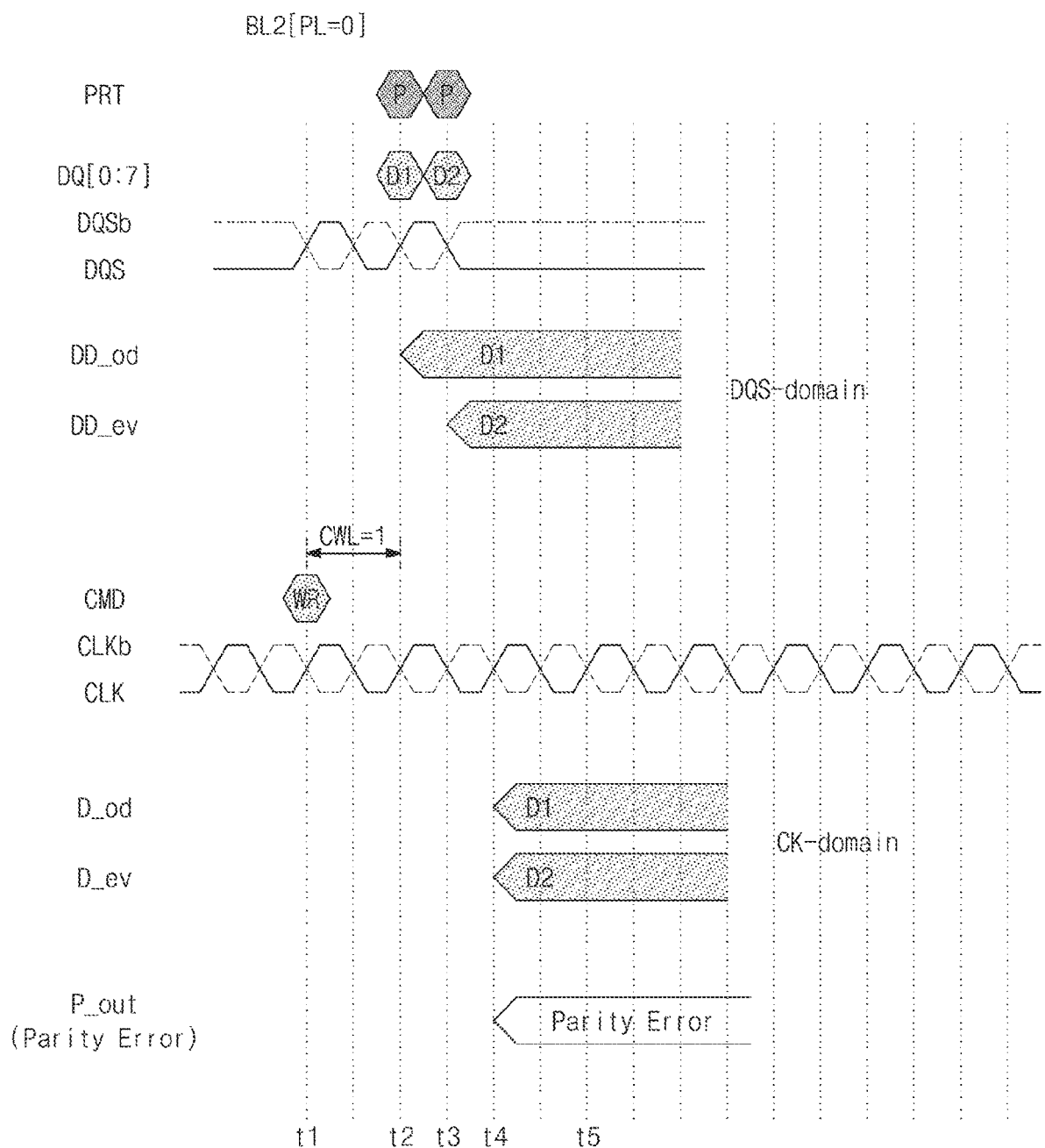
FIG. 10 is a timing diagram illustrating signals generated when the memory system illustrated in FIG. 1 operates.

FIG. 10 is a timing diagram illustrating signals generated when the memory system illustrated in FIG. 1 operates. The timing diagram of FIG. 10 will be described with reference to FIGS. 1, 2, and 5. Referring to FIG. 10, the parity output signal P_out that is generated based on the data strobe signal DQS including no post-amble is maintained after the second data D2 are provided. Here, it is assumed that the burst length BL is "2" and the parity latency "PL" is "0".

At a time point t1, the memory device 1200 may receive a write command WR, clock signals CLK and CLKb, and a pre-amble signal of the data strobe signal DQS from the host 1100. The command/address latch 1260 may sample the write command WR by the clock signals CLK and CLKb. The memory device 1200 may perform a write operation by the sampled write command WR. Assuming that a write latency CWL is "1", first data D1 may be provided at a time point t2 after a period of the clock signal CLK elapses from the time point t1.

At a point in time t2, the memory device 1200 may receive the first data D1 from the host 1100. The first DQS aligner 1211 of the memory device 1200 may sample the first data D1 by the rising edge of the data strobe signal DQS and output the sampled data as the odd data DD_od. At a point in time t3, the memory device 1200 may receive second data D2 from the host 1100. The first DQS aligner 1211 of the memory device 1200 may sample the second data D2 by the falling edge of the data strobe signal DQS and output the sampled data as the even data DD_ev.

At a time point t4, the first clock aligner 1212 of the memory device 1200 may sample the odd data DD_od and the even data DD_ev by the rising edge of the clock signal CLK, respectively, and output the sampled data as the odd alignment data D_od and the even alignment data D_ev, respectively. The parity error detection circuit 1220 may generate the parity output signal P_out based on the odd alignment data D_od and the even alignment data D_ev. In the example of FIG. 10, if the mask circuit 1224 of the parity error detection circuit 1220 does not operate, the parity output signal P_out continuously maintains the same parity error result even after a time point t5.

Figure 11:
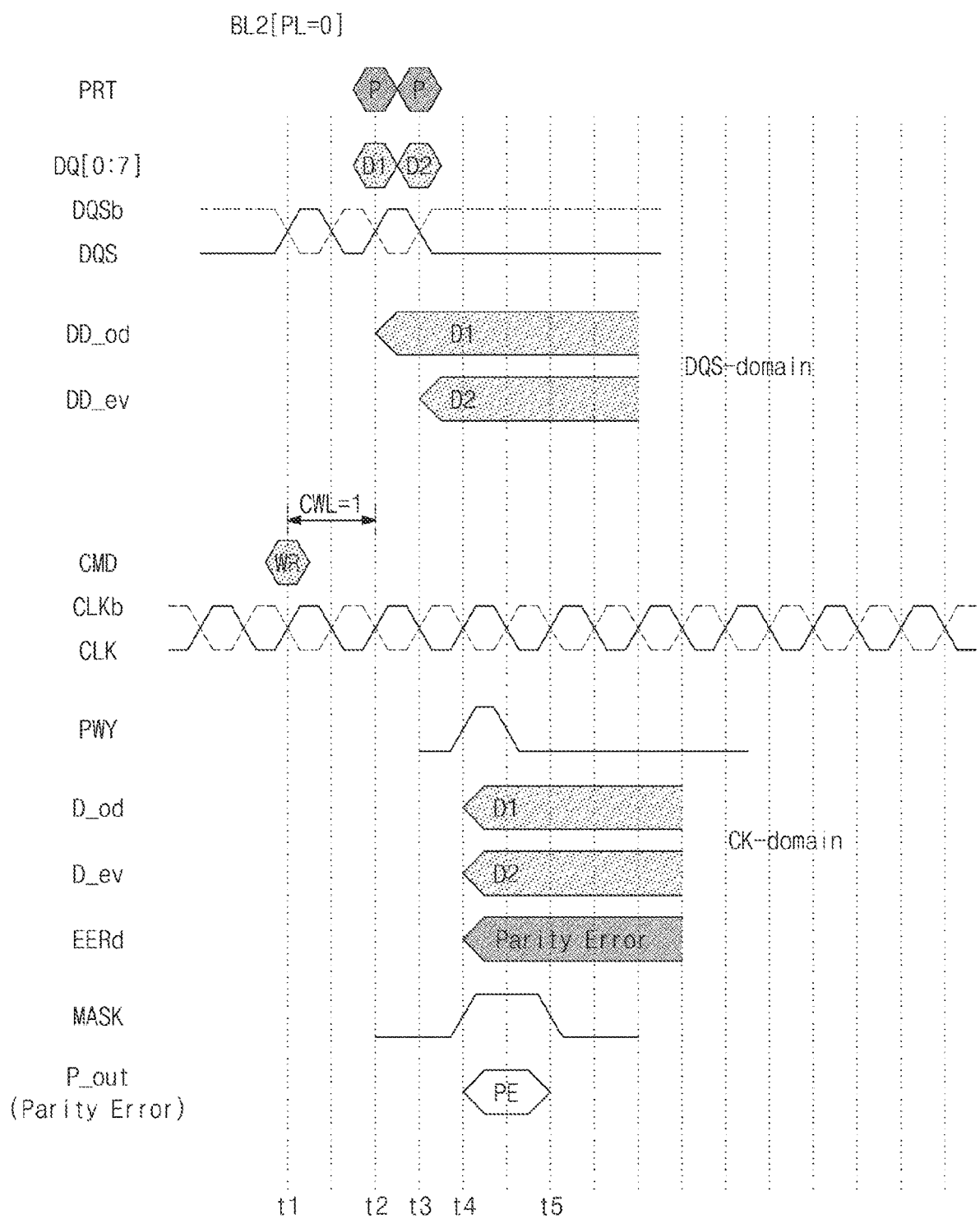
FIG. 11 is a timing diagram illustrating signals generated when the parity error detection circuit illustrated in FIG. 1 operates.

FIG. 11 is a timing diagram illustrating signals generated when the parity error detection circuit illustrated in FIG. 1 operates. The timing diagram of FIG. 11 will be described with reference to FIGS. 1, 2, 5, and 10. Like the example of FIG. 10, in an example of FIG. 11, the memory device 1200 may be provided with the data strobe signal DQS, which does not include a post-amble, from the host 1100. In the example of FIG. 11, it is assumed that the burst length BL is "2" and the parity latency "PL" is "0".

Compared with the example of FIG. 10, in the example of FIG. 11, the parity output signal P_out may be generated based on the data strobe signal DQS, which includes no post-amble, and output during one period of the clock signal CLK by the mask signal MASK, which is generated by the mask circuit 1224. Operations of the memory device 1200 from t1 to t3 are the same as operations described with reference to FIG. 10, and a description thereof is thus omitted.

At a time point t4, the parity error detection circuit 1220 may generate the delayed error signal ERRd based on the odd alignment data D_od and the even alignment data D_ev. As described above, the delayed error signal ERRd may include the delayed odd error signal ERRd_od and the delayed even error signal ERRd_ev. The decoded pulse write commands PWY may be provided to the second parity latency unit 1223, and the second parity latency unit 1223 may delay the decoded pulse write commands PWY, and thus output the delayed decoded pulse write commands PWYd. However, in the example of FIG. 11, because the parity latency PL is assumed to be "0", the delayed decoded pulse write command PWYd may be output at a time point t4 without delay.

Subsequently, the mask signal generator 1225 may generate the mask signal MASK based on the delayed decoded pulse write command PWYd and the burst length BL. In the example of FIG. 11, because the burst length BL is assumed to be "2," the mask signal MASK may include a pulse that has a length of a period of the clock signal CLK. The error signal generator 1226 may generate the parity output signal P_out based on the delayed odd error signal ERRd_od and the delayed even error signal ERRd_ev, and output the parity output signal P_out during a time period corresponding to a pulse width of the mask signal MASK. After a time point t5, the error signal generator 1226 may stop to output the parity output signal P_out.

Accordingly, even though the memory device 1200 is provided with the post-amble-free data strobe signal DQS, the memory device 1200 may output the parity output signal Pout during a time period that is determined according to the burst length BL.

Figure 12:
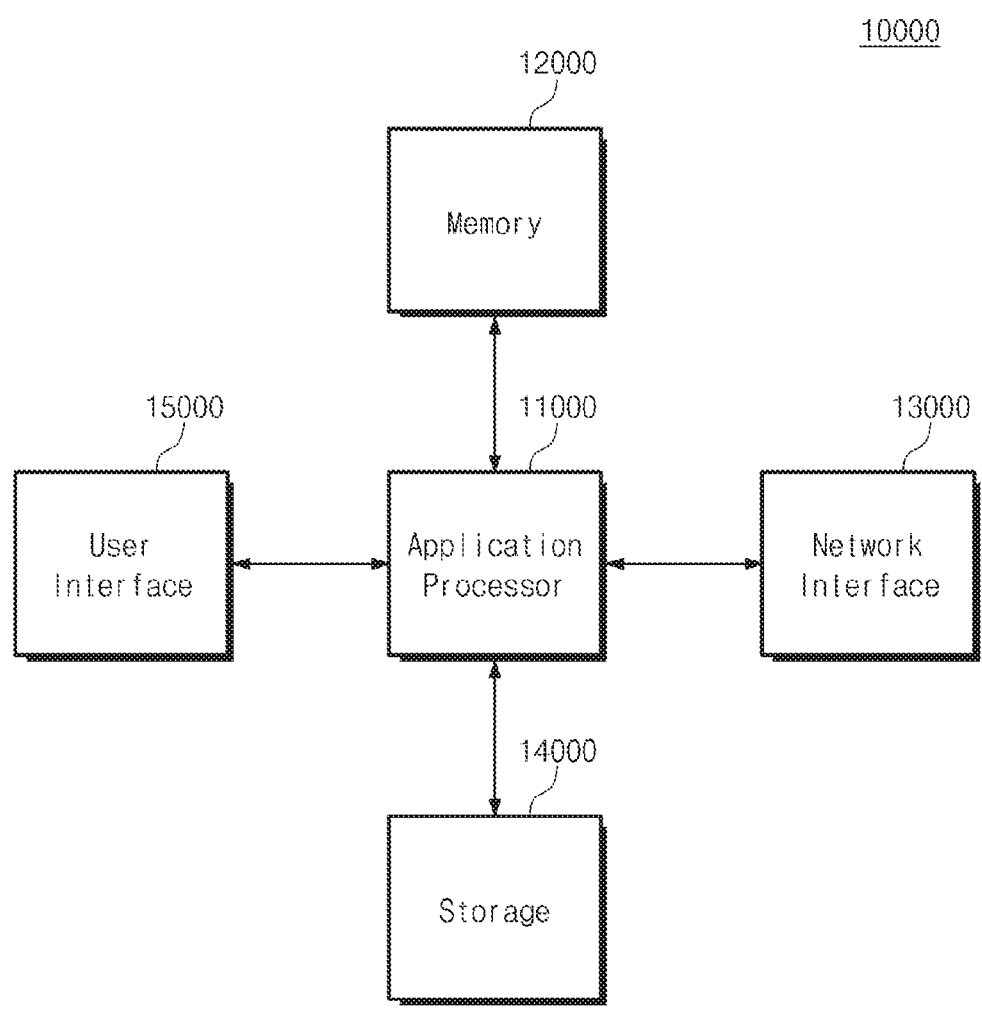
FIG. 12 is a block diagram illustrating a user system to which a memory device according to an example embodiment of the inventive concepts is applied.

FIG. 12 is a block diagram illustrating a user system to which a memory device according to an example embodiment of the inventive concepts is applied. Referring to FIG. 12, a user system 10000 may include an application processor 11000, a memory 12000, a network interface 13000, a storage 14000, and a user interface 15000.

The application processor 11000 may drive elements and an operating system that are included in the user system 10000. For example, the application processor 11000 may include controllers for controlling elements of the user system 10000, interfaces, graphics engines, etc. The application processor 11000 may be implemented with a system-on-chip (SoC).

The memory 12000 may operate as a main memory, a working memory, a buffer memory, or a cache memory of the user system 10000. The memory 12000 may be implemented with a volatile random access memory (e.g., a DRAM, an SDRAM, a double date rate (DDR) SDRAM, a DDR2 SDRAM, a DDR3 SDRAM, a Low Power DDR (LPDDR) SDRAM, an LPDDR2 SDRAM, an LPDDR3 SDRAM, or a High Bandwidth Memory HBM) or a nonvolatile random access memory (e.g., a phase-change RAM (PRAM), a magnetic RAM (MRAM), a resistive RAM (RRAM), or a ferroelectric RAM (FRAM)).

For example, a controller, which is included in the application processor 11000, and the memory 12000 may constitute the memory system 1000 described with reference to FIGS. 1 to 11. For example, the controller included in the application processor 11000 may correspond to the host 1100 of FIG. 1, and the memory 12000 may correspond to the memory device 1200 of FIG. 1. That is, the memory 12000 may include the parity error detection circuit 1220 illustrated in FIG. 1 that performs a parity error detection operation.

The network interface 13000 may communicate with external devices. For example, the network interface 13000 may support wireless communications (e.g., code division multiple access (CDMA), global system for mobile communication (GSM), wideband CDMA (WCDMA), CDMA-2000, time division multiple access (TDMA), long term evolution (LTE), WiMax, wireless local area network (WLAN), Ultra WideBand (UWB), Bluetooth, and/or Wireless Display (WI-DI). Here, the network interface 13000 may be included in the application processor 11000.

The storage 14000 may store data. For example, the storage 14000 may store data received from the application processor 11000. In some example embodiments, the storage 14000 may transmit data stored therein to the application processor 11000. For example, the storage 14000 may be implemented with a nonvolatile semiconductor memory device (e.g., a PRAM, an MRAM, a RRAM, a NAND flash memory, a NOR flash memory, or a three-dimensional NAND flash memory).

The user interface 15000 may include an interface which inputs data or a command to the application processor 11000 or outputs data to an external device. For example, the user interface 15000 may include user input interfaces (e.g., a keyboard, a keypad, a button, a touch panel, a touch screen, a touch pad, a touch ball, a camera, a microphone, a gyroscope sensor, a vibration sensor, or piezoelectric element). The user interface 15000 may further include user output interfaces (e.g., a liquid crystal display (LCD), an organic light-emitting diode (OLED) display device, an active matrix OLED (AMOLED) display device, a light-emitting diode (LED), a speaker, or a motor).

According to an example embodiment of the inventive concepts, even though a memory device including a parity error detection circuit receives a data strobe signal having no post-amble, a parity output signal may be output during a time period that is determined according to a burst length.

While the inventive concepts have been described with reference to some example embodiments, it will be apparent to those skilled in the art that various changes and modifications may be made without departing from the spirit and scope of the inventive concepts. Therefore, it should be understood that the above example embodiments are not limiting, but illustrative.

What is claimed is:

1. A memory device comprising:
   an aligner configured to sample data by a data strobe signal, the data strobe signal including a pre-amble and not including a post-amble; and
   a parity error detection circuit configured to,
      perform parity check on the data sampled by the aligner to generate a parity error signal, and
      output the parity error signal for a time period, the time period determined according to a burst length of the data, the parity error signal indicating whether a parity error is generated in the data based on results of the parity check.

2. The memory device of claim 1, wherein the parity error detection circuit comprises:
   a mask signal generator configured to generate a mask signal based on a write command, the mask signal activated during the time period determined according to the burst length of the data; and
   an error signal generator configured to generate the parity error signal based on the mask signal and the results of the parity check.

3. The memory device of claim 2, wherein the error signal generator is further configured to,
   receive a parity signal from a host, and
   generate the parity error signal by performing an additional parity check on the results of the parity check based on the parity signal.

4. The memory device of claim 3, wherein the parity error detection circuit configured to,
   delay the write command based on a parity latency and provide the delayed write command to the mask signal generator, and
   delay the results of the parity check based on the parity latency and provide the delayed results of the parity check to the error signal generator,
   wherein the error signal generator is configured to receive the parity signal and the results of the parity check delayed according to the parity latency.

5. The memory device of claim 4, further comprising:
   a mode register configured to store information of the parity latency from the host and provide the stored information of the parity latency to the parity error detection circuit.

6. The memory device of claim 1, further comprising:
   a mode register configured to store information of the burst length from a host, and provide the stored information of the burst length to the parity error detection circuit.

* * * * *